(12) United States Patent
Gao et al.

(10) Patent No.: US 11,664,805 B2
(45) Date of Patent: May 30, 2023

(54) DATA MUTEX FILTER CIRCUIT AND DATA MUTEX FILTERING METHOD

(71) Applicants: Beijing BOE Optoelectronics Technology Co., Ltd., Beijing (CN); BOE Technology Group Co., Ltd., Beijing (CN)

(72) Inventors: Yang Gao, Beijing (CN); Yuxin Bi, Beijing (CN); Xingyu Guo, Beijing (CN); Yaofeng Li, Beijing (CN); Kai Cui, Beijing (CN); Ying Chen, Beijing (CN); Jinyuan Yang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 36 days.

(21) Appl. No.: 17/527,585

(22) Filed: Nov. 16, 2021

(65) Prior Publication Data
US 2022/0263511 A1 Aug. 18, 2022

(30) Foreign Application Priority Data
Feb. 18, 2021 (CN) .......................... 202110190115.1

(51) Int. Cl.
H03K 19/17736 (2020.01)
H03K 5/26 (2006.01)
H03K 5/24 (2006.01)
H03K 19/20 (2006.01)

(52) U.S. Cl.
CPC ..... *H03K 19/17744* (2013.01); *H03K 5/2472* (2013.01); *H03K 5/26* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 11,494,315 B1* | 11/2022 | Janssens | G06F 13/1668 |
| 2018/0054186 A1* | 2/2018 | Chen | H03H 17/0009 |
| 2020/0177165 A1* | 6/2020 | Skinner | H03H 17/0202 |
| 2020/0348942 A1* | 11/2020 | Döge | G06F 9/3871 |
| 2022/0318185 A1* | 10/2022 | Wei | G06F 15/80 |

* cited by examiner

*Primary Examiner* — Jany Richardson
(74) *Attorney, Agent, or Firm* — Nath, Goldberg & Meyer; Joshua B. Goldberg

(57) ABSTRACT

The present disclosure provides a data mutex filter circuit and a data mutex filtering method. The data mutex filter circuit has a main input terminal and a main output terminal and including a preprocessing sub-circuit and a 1st-stage filter sub-circuit to an Nth-stage filter sub-circuit which are cascaded, N being an integer greater than or equal to 2. The 1st-stage filter sub-circuit has an input terminal coupled to the preprocessing sub-circuit, and the Nth-stage filter sub-circuit has an output terminal coupled to the main output terminal. Each stage of filter sub-circuit is configured to compare whether input data currently received at the main input terminal is the same as history data stored therein, and feed back a comparison result to the preprocessing sub-circuit; the preprocessing sub-circuit outputs corresponding data to the 1st-stage filter sub-circuit according to the comparison result fed back by each stage of filter sub-circuit.

17 Claims, 9 Drawing Sheets

DATA MUTEX FILTER CIRCUIT AND DATA MUTEX FILTERING METHOD

CROSS-REFERENCE TO RELATED APPLICATION

This application claims the benefit of priority to Chinese Patent Application No. 202110190115.1 filed on Feb. 18, 2021, the contents of which are incorporated herein in their entirety by reference.

TECHNICAL FIELD

The present disclosure relates to the field of data processing technology, and particularly relates to a data mutex filter circuit and a data mutex filtering method.

BACKGROUND

In the fields of data transmission, image processing, and the like based on digital (integrated) circuit technology, when the same data are continuously output in a specific neighborhood in a data stream, it is often related to merging of the same data. For example, in the preprocessing of gray-scale equalization of an image, gray-scale data may be used as an address of a static random-access memory (SRAM), and when two or more identical gray-scale data are continuously input, a read-write conflict may occur in the operation of the SRAM (due to read-write latency). In addition, in the data transmission process, the transmission of identical data in the limited neighborhood may cause the waste of bandwidth resources and reduce the utilization rate of hardware resources and bandwidth resources.

SUMMARY

In one aspect, the present disclosure provides a data mutex filter circuit having a main input terminal and a main output terminal and including a preprocessing sub-circuit and a plurality of stages of filter sub-circuits which are cascaded, wherein the plurality of stages of filter sub-circuits includes a 1st-stage filter sub-circuit to an Nth-stage filter sub-circuit, where N is an integer greater than or equal to 2, the 1st-stage filter sub-circuit has an input terminal coupled to the preprocessing sub-circuit, and the Nth-stage filter sub-circuit has an output terminal coupled to the main output terminal;

each of the plurality of stages of filter sub-circuits is configured to compare input data currently received at the main input terminal and history data stored in the stage of filter sub-circuit to determine whether they are the same, and feed back a comparison result to the preprocessing sub-circuit;

the preprocessing sub-circuit is configured to output corresponding data to the 1st-stage filter sub-circuit according to the comparison result fed back by each of the plurality of stages of filter sub-circuits; and in response to the comparison result fed back by at least one of the plurality of stages of filter sub-circuits indicating that the input data currently received at the main input terminal is the same as the history data stored therein, the preprocessing sub-circuit outputs a placeholder, and in response to the comparison result fed back by each of the plurality of stages of filter sub-circuits indicating that the input data currently received at the main input terminal is different from the history data stored therein, the preprocessing sub-circuit outputs the input data.

In an embodiment, the preprocessing sub-circuit includes a first data selector and an OR gate; each of the plurality of stages of filter sub-circuits includes a data register and a comparator;

the data register of the 1st-stage filter sub-circuit has an input terminal coupled to an output terminal of the first data selector, and an output terminal coupled to an input terminal of the data register of a 2nd-stage filter sub-circuit;

the data register of the Nth-stage filter sub-circuit has an output terminal coupled to the main output terminal;

in each of the plurality of stages of filter sub-circuits, the comparator has a first input terminal coupled to an output terminal of the data register, a second input terminal coupled to the main input terminal, and an output terminal coupled to one of a plurality of input terminals of the OR gate, wherein the output terminal of the comparator outputs the comparison result; and the first data selector has a first input terminal coupled to the main input terminal, a second input terminal coupled to a placeholder output terminal to receive the placeholder, and a first selection terminal coupled to an output terminal of the OR gate, and an output terminal.

In an embodiment, N is greater than 2, the data register of the Nth-stage filter sub-circuit has an input terminal coupled to an output terminal of the data register of a (N−1)th-stage filter sub-circuit, and an output terminal coupled to the main output terminal, and the data register of an Mth-stage filter sub-circuit has an input terminal coupled to an output terminal of the data register of a (M−1)th-stage filter sub-circuit, and an output terminal coupled to an input terminal of the data register of a (M+1)th-stage filter sub-circuit, M being an integer larger than 1 and smaller than N.

In an embodiment, each of the plurality of stages of filter sub-circuits is further configured to transmit the history data stored therein to a next-stage filter sub-circuit, in response to receiving the input data.

In an embodiment, the data register of each of the plurality of stages of filter sub-circuits further includes a clock input terminal coupled to a clock signal source; and the clock input terminals of the data registers of the plurality of stages of filter sub-circuits are coupled to a same clock signal source.

In an embodiment, each of the plurality of stages of filter sub-circuits further includes: a frequency counting component coupled to the comparator and the data register of the stage of filter sub-circuit, and configured to count, in a first time period, a frequency of a same input data in the input data received by the main input terminal, as frequency data.

In an embodiment, the data mutex filter circuit further includes: a main frequency data output terminal, wherein the frequency counting component includes: a frequency register and a second data selector, wherein in each of the plurality of stages of filter sub-circuits, the second data selector has a first input terminal, a second selection terminal and an output terminal, the first input terminal and the second input terminal of the second data selector are both coupled to an output terminal of the frequency register, and the frequency data input to the second input terminal of the second data selector is equal to a sum of the frequency data input to the first input terminal and a constant of 1, and the second selection terminal is coupled to the output terminal of the comparator, an output terminal of the second data selector of the Nth-stage filter sub-circuit is coupled to the main frequency data output terminal, and an output terminal of the second data selectors of each of the other stages of filter sub-circuits is coupled to an input terminal of the frequency register of a next-stage filter sub-circuit, and an input terminal of the frequency register of the 1st-stage filter sub-circuit is coupled to the output terminal of the OR gate.

In an embodiment, the frequency counting component further includes an adder having an input terminal coupled to the output terminal of the frequency register, and an output terminal coupled to the second input terminal of the second data selector.

In an embodiment, the preprocessing sub-circuit further includes: a NOT gate having an input terminal coupled to the output terminal of the OR gate, and an output terminal coupled to the input terminal of the frequency register of the 1st-stage filter sub-circuit.

In an embodiment, the data mutex filter circuit further includes a data selection sub-circuit configured to filter out invalid data and pass valid data, wherein after the valid data input into the main input terminal passes through the data selection sub-circuit, the valid data is used as the input data to be provided to the preprocessing sub-circuit and the plurality of stages of filter sub-circuits.

In an embodiment, the data selection sub-circuit includes an AND gate having an input terminal serving as the main input terminal, an enable terminal coupled to an enable signal terminal, and an output terminal coupled to the preprocessing sub-circuit and the plurality of stages of filter sub-circuits.

In an embodiment, the placeholder is invalid data.

In another aspect, the present disclosure further provides a data mutex filtering method, applied to the data mutex filter circuit according to the embodiments of the present disclosure, and the method includes:

comparing, by each of the plurality of stages of filter sub-circuits, the input data currently received at the main input terminal and the history data stored in the stage of filter sub-circuit to determine whether they are the same, and feeding back the comparison result to the preprocessing sub-circuit;

outputting, by the preprocessing sub-circuit, corresponding data to the 1st-stage filter sub-circuit according to the comparison result fed back by each of the plurality of stages of filter sub-circuits; and if the comparison result fed back by at least one of the plurality of stages of filter sub-circuits indicates that the input data currently received at the main input terminal is the same as the history data stored in the stage of filter sub-circuit, outputting a placeholder, and if the comparison result fed back by each of the plurality of stages of filter sub-circuits indicates that the input data currently received at the main input terminal is different from the history data stored in the stage of filter sub-circuit, outputting the input data.

In an embodiment, the method further includes:

when a stage of filter sub-circuit stores the input data, outputting the history data stored therein to a next-stage filter sub-circuit.

In an embodiment, the method further includes:

counting a frequency of the input data, by each of the plurality of stages of filter sub-circuits, to obtain frequency data, wherein the frequency data is transmitted to a next-stage filter sub-circuit along with the input data.

DETAILED DESCRIPTION

Figure 1:
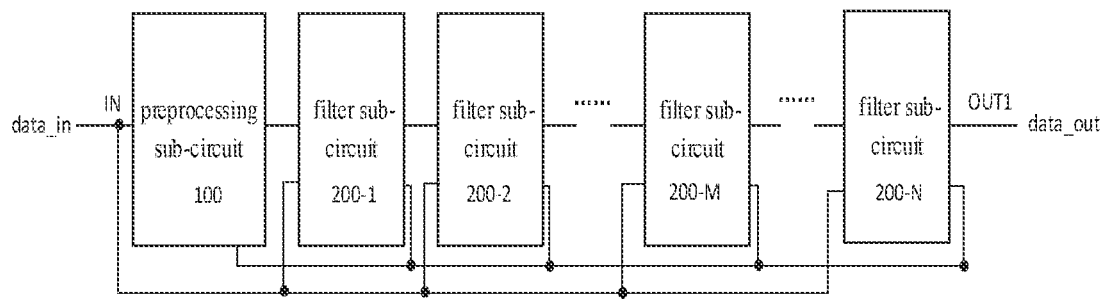
FIG. 1 is a schematic architecture diagram illustrating an implementation of a data mutex filter circuit according to an embodiment of the present disclosure.

In order to make the objects, technical solutions and advantages of the present disclosure more apparent, the present disclosure will be described in further detail with reference to the accompanying drawings. Obviously, the described embodiments are only a part, not all, of embodiments of the present disclosure. All other embodiments, which can be obtained by a person skilled in the art without making any creative effort based on the embodiments in the present disclosure, belong to the protection scope of the present disclosure.

The shapes and sizes of the components in the drawings are not to scale, but are merely intended to facilitate an understanding of the contents of the embodiments of the present disclosure.

Unless defined otherwise, technical or scientific terms used in the present disclosure shall have the ordinary meaning as understood by one of ordinary skill in the art to which the present disclosure belongs. The terms "first", "second", and the like as used in the present disclosure are not intended to indicate any order, quantity, or importance, but rather to distinguish one element from another. Similarly, the term "a", "an", "the" or the like do not denote a limitation of quantity, but rather denote the presence of at least one. The term "include", "comprise", or the like, means that the element or item preceding the term includes the element or item listed after the term and its equivalent, but does not exclude other elements or items. The term "coupled", "connected" or the like is not restricted to physical or mechanical connections, but may include electrical connections, whether direct or indirect. The terms "upper", "lower", "left", "right", and the like are used only to indicate relative positional relationships, and when the absolute position of the object being described is changed, the relative positional relationships may also be changed accordingly.

The embodiments of the present disclosure are not limited to the embodiments shown in the drawings, but include modifications of configurations formed based on a manufacturing process. Thus, the regions illustrated in the drawings have schematic properties, and the shapes of the regions shown in the drawings illustrate specific shapes of regions of elements, but are not intended to be limited.

In a first aspect, an embodiment of the disclosure provides a data mutex filter circuit, which includes a preprocessing sub-circuit 100 and N stages of filter sub-circuits 200, where N is an integer greater than or equal to 2. In an embodiment, the N stages of filter sub-circuits 200 are cascaded and referred to as a first-stage (or 1st-stage) filter sub-circuit 200-1, a second-stage (or 2nd-stage) filter sub-circuit 200-2, . . . , and an Nth-stage filter sub-circuit 200-N, respectively.

In an embodiment, in a case of N=2, that is, the data mutex filter circuit includes only two stages of filter sub-circuits 200, an input terminal of the 1st-stage filter sub-circuit 200-1 is coupled to an output terminal of the preprocessing sub-circuit 100, an output terminal of the 1st-stage filter sub-circuit 200-1 is coupled to an input terminal of the 2nd-stage filter sub-circuit, and an output terminal of the 2nd-stage filter sub-circuit is coupled to an main output terminal OUT1 of the data mutex filter circuit.

In a case where N is greater than 2, the input terminal of the 1st-stage filter sub-circuit 200-1 is coupled to the preprocessing sub-circuit 100, and the output terminal of the 1st-stage filter sub-circuit 200-1 is coupled to the input terminal of the 2nd-stage filter sub-circuit; an input terminal of the Nth-stage (namely, the last-stage) filter sub-circuit 200-N is coupled to an output terminal of an (N−1)th-stage filter sub-circuit 200-(N−1), and an output terminal of the Nth-stage filter sub-circuit 200-N is coupled to the main output terminal OUT1; an input terminal of an Mth-stage filter sub-circuit 200-M is coupled to an output terminal of a (M−1)th-stage filter sub-circuit 200-(M−1), and an output terminal of the Mth-stage filter sub-circuit 200-M is coupled to an input terminal of a (M+1)th-stage filter sub-circuit 200-(M+1), where M is an integer, and M is greater than 1 and smaller than N.

That is to say, for a filter sub-circuit between the 1st-stage filter sub-circuit and the last-stage filter sub-circuit, an input terminal of the filter sub-circuit is coupled to the output terminal of a previous-stage filter sub-circuit, and an output terminal of the filter sub-circuit is coupled to an input terminal of a next-stage filter sub-circuit, so that when the filter sub-circuit stores an input data, the history data of the filter sub-circuit which has been originally stored is transmitted to the next-stage filter sub-circuit for storage. Whether the input data currently received at the main input terminal IN of the data mutex filter circuit is to be stored into the 1st-stage filter sub-circuit 200-1 is always determined by the preprocessing sub-circuit 100. If the 1st-stage filter sub-circuit 200-1 stores the input data, the history data previously stored in the 1st-stage filter sub-circuit 200-1 is transmitted to the 2nd-stage filter sub-circuit 200-2, the history data previously stored in the 2nd-stage filter sub-circuit 200-2 is transmitted to the 3rd-stage filter sub-circuit 200-3 . . . , the Nth-stage filter sub-circuit 200-N stores the history data transmitted from the (N−1)th-stage filter sub-circuit 200-(N−1), and the history data previously stored in the Nth-stage filter sub-circuit 200-N is output to a subsequent circuit through the main output terminal OUT1 as output data data_out of the data mutex filter circuit. That is, data is always transferred from the 1st-stage filter sub-circuit 200-1 to the Nth-stage filter sub-circuit stage by stage, and data output by the Nth-stage filter sub-circuit is the output data data_out of the data mutex filter circuit, that is, a pipeline-type data mutex filter circuit is formed, which can realize continuous input and continuous output of data, and can be adapted to a pipeline architecture.

Further, whenever the main input terminal IN of the data mutex filter circuit receives input data, the input data is firstly transmitted to each stage of filter sub-circuit 200 (but not stored therein at first), and each stage of filter sub-circuit 200 may determine whether the input data data_in currently received by the main input terminal IN is the same as the history data stored therein, and feed back a comparison result (e.g., "same" or "different") to the preprocessing sub-circuit 100. The preprocessing sub-circuit 100 outputs corresponding data (e.g. a preset placeholder or the input data currently received) to the 1st-stage filter sub-circuit 200 according to the comparison result fed back by each stage of filter sub-circuit 200. Specifically, if the comparison result fed back by at least one stage of filter sub-circuits 200 is "same", that is, the current input data is the same as the history data stored in the at least one stage of filter sub-circuits 200 among all stages of filter sub-circuits 200, the preprocessing sub-circuit 100 outputs the preset placeholder to the 1st-stage filter sub-circuit 200; if the comparison results fed back by all the filter sub-circuits 200 are "different", that is, the current input data is different from the history data stored in all stages of filter sub-circuits 200, the preprocessing sub-circuit 100 outputs the input data data_in to the 1st-stage filter sub-circuit 200-1. The preprocessing sub-circuit 100 outputs a preset placeholder or input data data_in to the 1st-stage filter sub-circuit 200-1, the 1st-stage filter sub-circuit 200-1 stores the placeholder or the input data data_in, and transmits the history data stored therein to the 2nd-stage filter sub-circuit 200-2, and then the data is updated stage by stage according to the above. In this way, when the input data data_in is the same as the history data in at least one stage of filter sub-circuits 200, the input data data_in is filtered out; and the input data data_in is stored in the 1st-stage filter sub-circuit 200-1 only when the input data data_in is different from the history data in each stage of filter sub-circuit 200. Therefore, within the preset range, the data in the data stream formed by the plurality of input data data_in that are continuously input is mutually exclusive (i.e. different), that is, if the same data exists in the preset range of the data stream, the data mutex filter circuit only outputs the data that appears first, filters out the other data which is the same as the data, and outputs the placeholder. This is equivalent to merging the same data to avoid the problems such as output confusion or read-write address conflict, etc., and can avoid the waste of transmission bandwidth and improve the operation efficiency. It is understood that each data in the data stream to be transmitted into the data mutex filter circuit is compared with the history data stored in each stage of filter sub-circuit 200, so that the number of the filter sub-circuits 200 and the number of the preprocessing sub-circuits 100 define the filter range (i.e. the above-mentioned preset range) of the data mutex filter circuit. Since the preprocessing sub-circuit 100 is necessary, and the number of the preprocessing sub-circuit 100 is 1, the filter range of the data mutex filter circuit may be adjusted by adjusting the number of the filter sub-circuits 200. It is understood that, for data processing, the filter range is equivalent to the size of the neighborhood, that is, the fact that the data stream is mutually exclusive in the preset range is equivalent to the fact that the data stream is mutually exclusive in the preset neighborhood.

It should be noted that, for the data mutex filter circuit in the initialization state, the data stored in each stage of filter sub-circuit 200 is 0, and it may be regarded that the history data of each stage of filter sub-circuit 200 in the initialization state is 0.

It should be noted that the placeholder can be any constant, and for example, the placeholder is 0. The placeholder is only for holding the place and does not affect the data in the data stream. In an embodiment, the placeholder may be invalid data. The following description is given by taking the case where the placeholder is 0 as an example.

Figure 2:
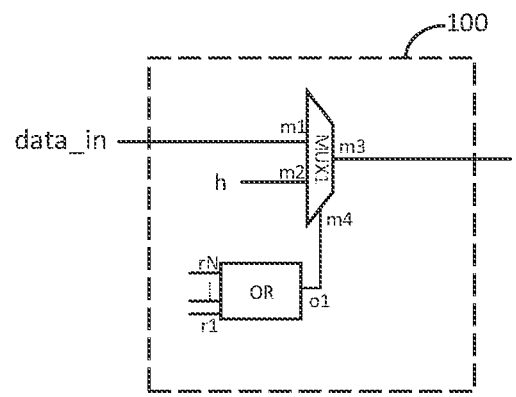
FIG. 2 is a circuit diagram of an implementation of a preprocessing sub-circuit of a data mutex filter circuit according to an embodiment of the disclosure.
Figure 3:
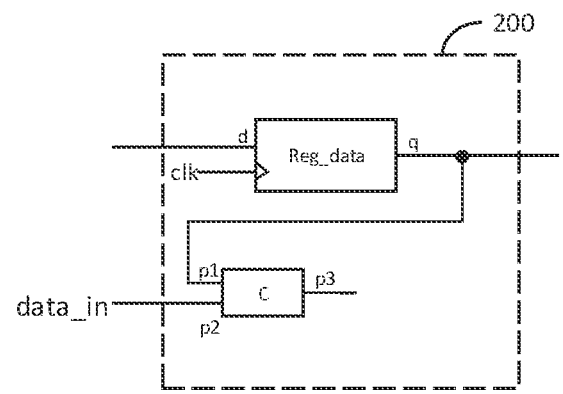
FIG. 3 is a circuit diagram of an implementation of a filter sub-circuit of a data mutex filter circuit according to an embodiment of the disclosure.

In some examples, the preprocessing sub-circuit 100 may have a variety of circuit configurations, and the filter sub-circuit 200 may also have a variety of circuit configurations. For example, referring to FIGS. 2 to 4, the preprocessing sub-circuit 100 may include a first data selector MUX1 and an OR gate (an element denoted by "OR" in the figure), the first data selector MUX1 has a first input terminal m1, a second input terminal m2, a first selection terminal m4 and an output terminal m3, and the OR gate has a plurality of input terminals r1 to rN, and an output terminal of. Each stage of filter sub-circuit 200 includes a data register Reg_data having an input terminal d and an output terminal q, and a comparator C having a first input terminal p1, a second input terminal p2, and an output terminal p3.

It should be noted that, for convenience of describing the data register Reg_data and the comparator C of each stage of filter sub-circuit 200, the data registers of the 1st-stage filter sub-circuit to the Nth-stage filter sub-circuit are respectively denoted as data registers Reg_data-1, Reg_data-2 . . . Reg_data-N; the input terminals d and the output terminals q of the data registers Reg_data are respectively denoted as d1, d2 . . . dN, q1, q2 . . . qN; the comparators C are respectively denoted as C-1, C-2 . . . C-N; the first input terminals p1, the second input terminals p2 and the output terminals p3 of the comparators C are respectively denoted as p11, p21 . . . pN1; p12, p22 . . . pN2; p13, p23 . . . pN3.

Figure 4:
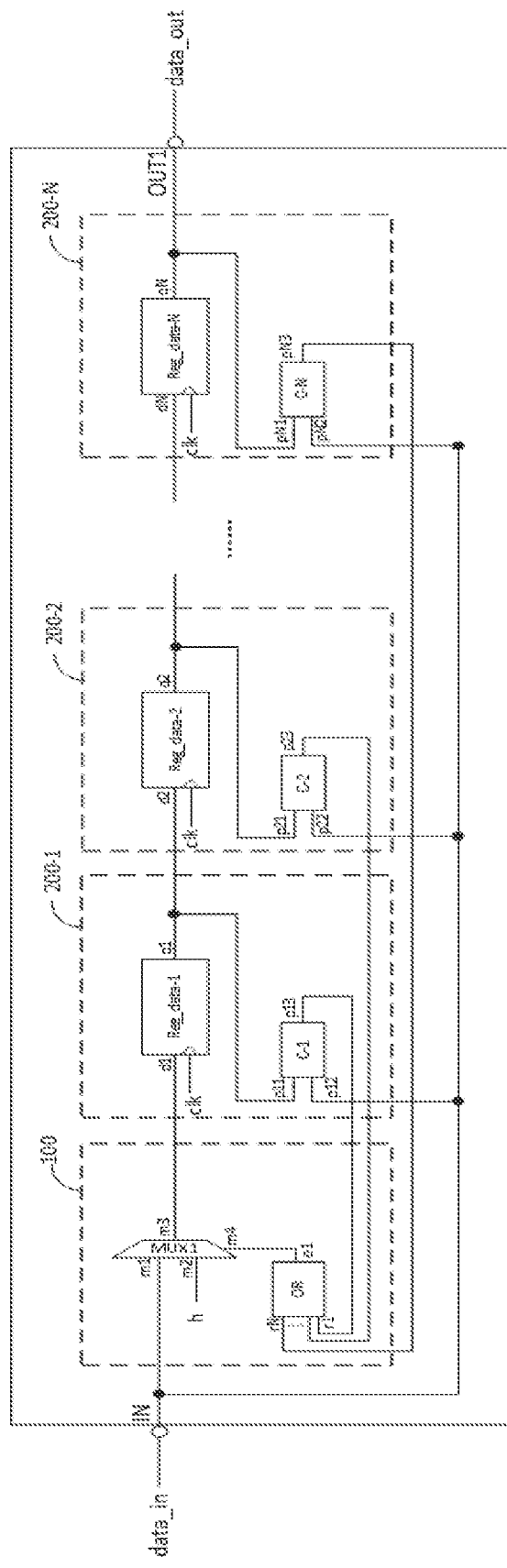
FIG. 4 is a circuit diagram of an implementation of a data mutex filter circuit according to an embodiment of the present disclosure.
Figure 5:
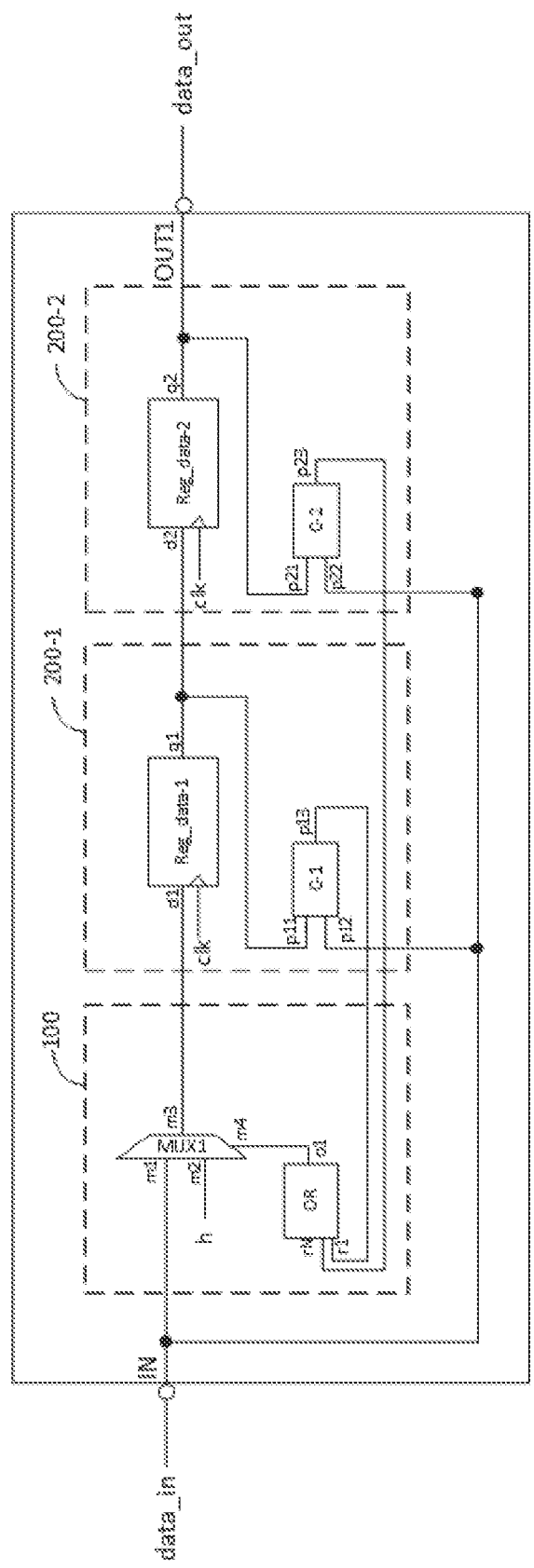
FIG. 5 is a circuit diagram of another implementation of a data mutex filter circuit according to an embodiment of the present disclosure (an embodiment of two stages of filter sub-circuits)
Figure 6:
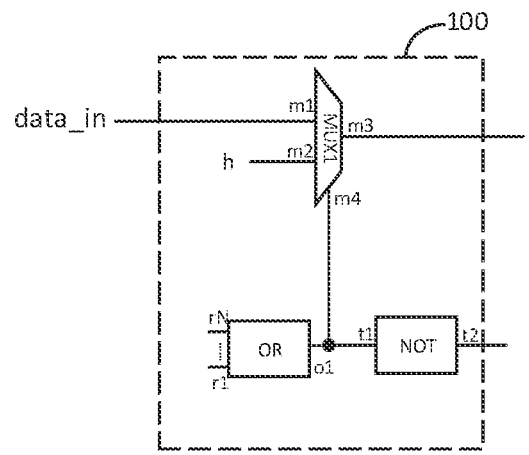
FIG. 6 is a circuit diagram of another implementation of a preprocessing sub-circuit of a data mutex filter circuit according to an embodiment of the disclosure.
Figure 7:
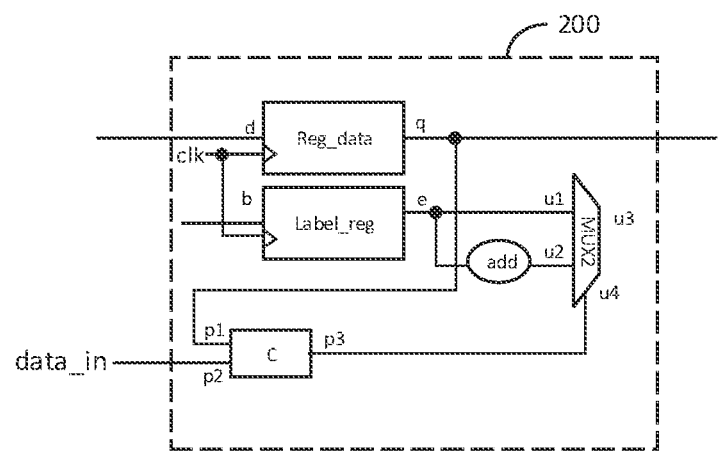
FIG. 7 is a circuit diagram of another implementation of a filter sub-circuit of a data mutex filter circuit according to an embodiment of the disclosure.

Specifically, referring to FIGS. 4 and 5, the input terminal d1 of the data register Reg_data-1 of the 1st-stage filter sub-circuit 200-1 is coupled to the output terminal m3 of the first data selector MUX of the preprocessing sub-circuit 100, and the output terminal q1 of the data register Reg_data-1 of the 1st-stage filter sub-circuit 200-1 is coupled to the input terminal d2 of the data register Reg_data-2 of the 2nd-stage filter sub-circuit 200-2; the input terminal dN of the data register Reg_data-N of the Nth-stage filter sub-circuit 200-N is coupled to the output terminal q(N−1) of the data register Reg_data-(N−1) of the (N−1)th-stage filter sub-circuit 200-(N−1), and the output terminal qN of the data register Reg_data-N of the Nth-stage filter sub-circuit 200-N is coupled to the main output terminal OUT1 of the data mutex filter circuit. In the case of N=2, referring to FIG. 5, the data mutex filter circuit includes only the 1st-stage filter sub-circuit 200-1 and the 2nd-stage filter sub-circuit 200-2. Accordingly, if N=2, the neighborhood of the data mutex filter circuit is N+1=3, which means that if the same data are present in any three adjacent data in the data stream, only the first one of the same data is output, and the other of the same data is filtered out, and the same principle is applied below. In a case of N>2, the input terminal dM of the data register Reg_data-M of the Mth-stage filter sub-circuit 200-M is coupled to the output terminal q(M−1) of the data register Reg_data (M−1) of the (M−1)th-stage filter sub-circuit 200-(M−1), and the output terminal qM of the data register Reg_data-M of the Mth-stage filter sub-circuit 200-M is coupled to the input terminal d(M+1) of the data register Reg_data-(M+1) of the (M+1)th-stage filter sub-circuit 200-(M+1). If the data register Reg_data of a certain stage of filter sub-circuit 200 receives and stores a data, the history data stored by itself is transmitted to the data register Reg_data of the next-stage filter sub-circuit 200, the data is transferred stage by stage, and the history data stored by the data register Reg_data of the last stage of filter sub-circuit 200 is output as the output data data_out of the data mutex filter circuit.

Further, in each stage of filter sub-circuit 200, the first input terminal p1 of the comparator C is coupled to the output terminal q of the data register Reg_data of the stage of filter sub-circuit 200, the second input terminal p2 of the comparator C is coupled to the main input terminal IN of the data mutex filter circuit, the output terminal p3 of the comparator C is coupled to one of the input terminals r1 to rN of the OR gate of the preprocessing circuit 100, and the output terminal o1 of the OR gate is coupled to the first selection terminal m4 of the first data selector MUX1. The first input terminal m1 of the first data selector MUX1 is coupled to the main input terminal IN of the data mutex filter circuit, the second input terminal m2 of the first data selector MUX1 is coupled to a placeholder output terminal h that provides the placeholder to the first data selector MUX1, and the first selection terminal m4 of the first data selector MUX1 is coupled to the output terminal o1 of the OR gate.

In some examples, the data register Reg_data of each stage of filter sub-circuit 200 further includes a clock input terminal coupled to a clock signal source, which outputs a clock signal clk. The clock signal clk includes alternating high and low levels, an alternating high and low levels is a clock cycle, and the main signal terminal IN receives an input data in each clock cycle, that is, the processing cycle of one data during which the data mutex filter circuit receives the input data is a clock cycle, which can be adapted to a pipeline architecture. Moreover, since the preprocessing circuit 100 is a pure logic circuit, and can be regarded as having no delay, the read-write latency of the data mutex filter circuit may be the sum of the processing cycles of the stages of filter sub-circuits 200, that is, the latency is N clock cycles. For a preset neighborhood (i.e., a preset range), the relationship between the size of the neighborhood and the latency is: the size of the neighborhood K (K is an integer)= latency+1, i.e., K=N−1. By taking the case of the three-neighborhood data mutex filter circuit shown in FIG. 5 as an example, in the data mutex filter circuit, the processing cycle of a single data is one clock cycle, and the latency is 2 clock cycles. The size of the preset neighborhood K can be understood as: when K adjacent data are sequentially supplied to the data mutex filter circuit, the data mutex filter circuit may identify the number of occurrences of the same data among the K adjacent data and output the data that occurs multiple times only once.

It should be noted that, in the data mutex filter circuit provided in the embodiment of the disclosure, since the processing cycle for a single data is one clock cycle, it can be understood that one input data data_in or output data data_out mentioned herein is a data of a data stream in each clock cycle.

In some examples, the clock input terminals of the data registers Reg_data of the stages of filter sub-circuits 200 are coupled to the same clock signal source, and receive the same clock signal clk; and of course, the clock input terminals of the data registers Reg_data of the stages of filter sub-circuits 200 may be coupled to different clock signal sources, but the clock signal sources output the clock signals clk having the same cycle, which is not limited herein.

The operating principle of the data mutex filter circuit provided by the embodiments of the present disclosure is as follows: the data stream is input through the main input terminal IN of the data mutex filter circuit, and is output through the main output terminal OUT1 after being filtered (the same data is merged in a preset neighborhood). Specifically, in response to the clock signal clk, in each clock cycle, the data mutex filter circuit performs the following operations: the main input terminal IN receives an input data data_in, the input data data_in is first transmitted to the first input terminal m1 of the first data selector MUX1 of the preprocessing sub-circuit 100 and to the second input terminal p2 of the comparator C of each stage of filter sub-circuit 200, while the first input terminal p1 of each comparator C obtains, from the output terminal q of the data register Reg_data of the filter sub-circuit 200 to which it belongs, the history data currently stored in the data register Reg_data, the comparator C compares the current input data data_in with the history data stored in the data register Reg_data to determine whether the two are the same, and feeds back the comparison result to corresponding one of the multiple inputs terminals r1 to rN of the OR gate of the preprocessing sub-circuit 100 through the output terminal p3 of the comparator C. In an embodiment, if the comparator C determines that the current input data data_in is the same as the history data stored in the data register Reg_data, the comparison result output by the output terminal p3 is 1; and if the comparator C determines that the current input data data_in is different from the history data stored in the data register Reg_data, the comparison result output by the output terminal p3 is 0.

The plurality of input terminals r1 to rN of the OR gate respectively receive the comparison results fed back by the output terminals p3 of the comparators C of the stages of filter sub-circuits 200. If the history data stored in the data register Reg_data of at least one stage of filter sub-circuit 200 among the stages of filter sub-circuits 200 is the same as the current input data data_in (i.e., if the comparison result fed back by the output terminal p3 of the comparator C of the at least one stage of filter sub-circuit 200 is 1), the output terminal o1 of the OR gate outputs 1 to the first selection terminal m4 of the first data selector MUX1, gates the second input terminal m2, and writes the placeholder provided by the placeholder output terminal h into the input terminal d1 of the data register Reg_data-1 of the 1st-stage of filter sub-circuit 200-1 through the output terminal m3 of the first data selector MUX 1.

Conversely, if the history data stored in the data registers Reg_data of all stages of filter sub-circuits 200 are different from the current input data data_in (i.e., if the comparison results fed back by the output terminals p3 of the comparators C of all stages of filter sub-circuits 200 are all 0), the output terminal o1 of the OR gate outputs 0 to the first selection terminal m4 of the first data selector MUX1, gates the first input terminal m1, and writes the current input data data_in into the input terminal d1 of the data register Reg_data-1 of the 1st-stage filter sub-circuit 200-1 through the output terminal m3 of the first data selector MUX 1. No matter whether the data register Reg_data-1 of the 1st-stage filter sub-circuit 200-1 stores the placeholder or the input data data_in, the history data originally stored therein is transmitted to the data register Reg_data-2 of the 2nd-stage filter sub-circuit 200-2; after the data register Reg_data-2 of the 2nd-stage filter sub-circuit 200-2 stores the data transmitted by the data register Reg_data-1 of the 1st-stage filter sub-circuit 200-1, the history data originally stored in the 2nd-stage filter sub-circuit 200-2 is transmitted to the data register Reg_data-3 of the 3rd-stage filter sub-circuit 200-3 . . . data is stored stage by stage, and then the output terminal qN of the data register Reg_data-N of the Nth-stage filter sub-circuit 200-N outputs the history data stored by the data register Reg_data-N through the main output terminal OUT 1 as the output data data_out.

It should be noted that duration during which the data register Reg_data of each stage of filter sub-circuit 200 stores and outputs data is one clock cycle, so that from the time when the input data data_in is received by the preprocessing sub-circuit 100, to the time when the output data data_out is output by the output terminal qN of the data register Reg_data-N of the Nth-stage filter sub-circuit 200-N is N clock cycles, i.e., the latency of the data mutex filter circuit is N clock cycles.

In summary, when each input data data_in is inputted to the data mutex filter circuit, the preprocessing sub-circuit 100 determines whether to write the input data data_in into the 1st-stage filter sub-circuit 200-1. If each stage of filter sub-circuit 200 does not store the same data as the input data data_in within the range of the preset neighborhood, the input data data_in is written into the 1st-stage filter sub-circuit 200-1. If at least one stage of filter sub-circuit 200 stores the same data as the input data data_in within the range of the preset neighborhood, the input data data in is filtered out, and the placeholder is written into the 1st-stage filter sub-circuit 200-1. After the data (placeholder or input data data_in) is stored in the 1st-stage filter sub-circuit 200-1, the data is transferred stage by stage in response to the clock signal clk, so that it is ensured that the data stream does not include the same data in each of the neighborhood ranges, and the sequencing of the data stream is not changed, after the data stream is filtered by the data mutex filter circuit. The neighborhood range (namely the number of the filter sub-circuits 200) is set according to the processing period of the subsequent circuit, so that the subsequent circuit can be prevented from continuously receiving the same data in the adjacent period to cause output disorder, misoperation and the like. In data processing, the problems such as bandwidth waste, reading conflict and the like caused by the existence of a large amount of invalid same data in a short time can be avoided.

In some examples, referring to FIGS. 6 to 9, in the data mutex filter circuit provided in the embodiment of the present disclosure, each stage of filter sub-circuit 200 further includes a frequency counting component, the frequency counting component is coupled to the comparator C1 of the stage of filter sub-circuit 200, and is coupled to the data register Reg_data of the stage of filter sub-circuit 200, and the frequency counting component is configured to count the frequency of the same data in each data stream received at the main input terminal. That is, the data mutex filter circuit may merge the same data of the data stream in a preset neighborhood, and may count the times of occurrence (i.e., frequency) of the same data. For example, if the data mutex filter circuit provided in the embodiment of the present disclosure is applied to the field of grayscale histogram statistics, a data stream composed of grayscale values of an image is input to the data mutex filter circuit, the same grayscale values can be merged in a preset neighborhood, and the number (i.e., frequency) of the same grayscale values can be counted, so that data processing amount can be reduced. The filtered data and the frequency statistical result are input to a static random-access memory (SRAM), the problem of latency conflict when the SRAM reads and writes via the same address after the data stream is input to the SRAM can be avoided, and the image can be equalized by using the filtered data and the frequency statistical result.

In some examples, referring to FIGS. 6-9, the data mutex filter circuit further includes a main frequency data output terminal OUT2 for outputting the frequency statistics result. The frequency counting component may include a variety of circuit configurations, and may include, for example, a frequency register Label_reg and a second data selector MUX2. In an embodiment, the frequency register Label_reg has an input terminal b and an output terminal e, and the second data selector MUX2 has a first input terminal u1, a second input terminal u2, a second selection terminal u4 and an output terminal u3.

It should be noted that, for convenience of describing the frequency register Label_reg and the second data selector MUX2 of the frequency counting component of each stage of filter sub-circuit 200, the frequency registers Label_reg of the 1st-stage filter sub-circuit to the Nth-stage filter sub-circuit are respectively denoted as Label_reg-1, Label_reg-2 . . . Label_reg-N; the input terminals b and the output terminals e of the frequency registers Label_reg are respectively denoted as b1, b2 . . . bN, and e1, e2 . . . eN; the second data selectors MUX2 are denoted as MUX2-1, MUX2-2 . . . MUX2-N, respectively; the first input terminals u1, the second input terminals u2, the second selection terminals u4 and the output terminals u3 of the second data selectors MUX2 are respectively denoted as u11, u21 . . . uN1; u12, u22 . . . uN2; u13, u23 . . . uN3; and u14, u24 . . . uN4.

Figure 8:
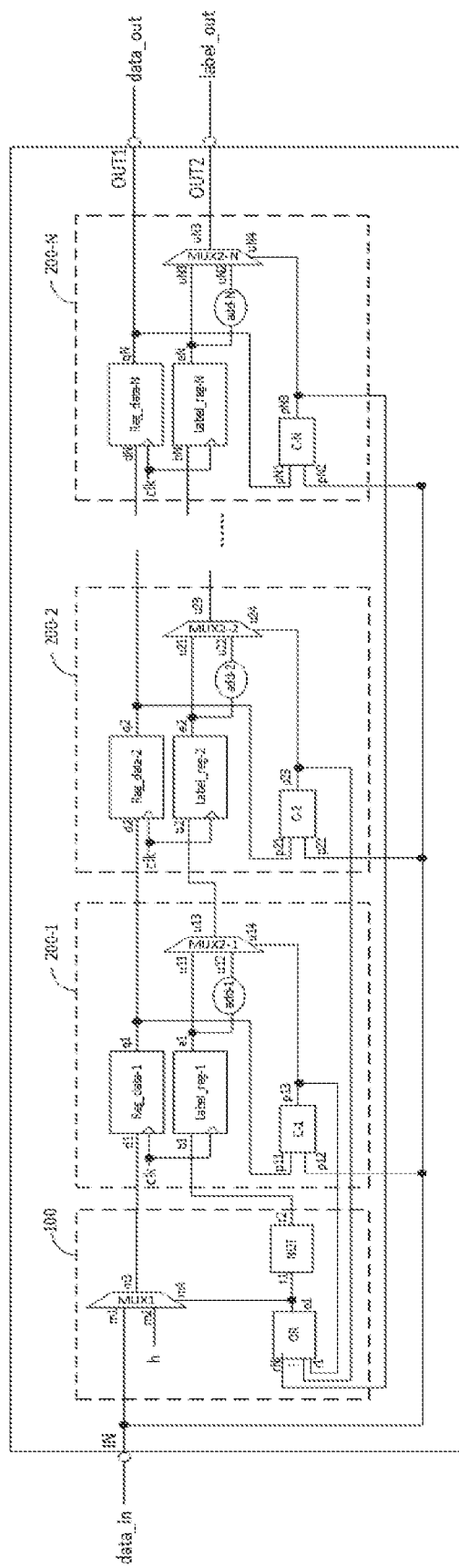
FIG. 8 is a circuit diagram of another implementation of a data mutex filter circuit according to an embodiment of the disclosure.
Figure 9:
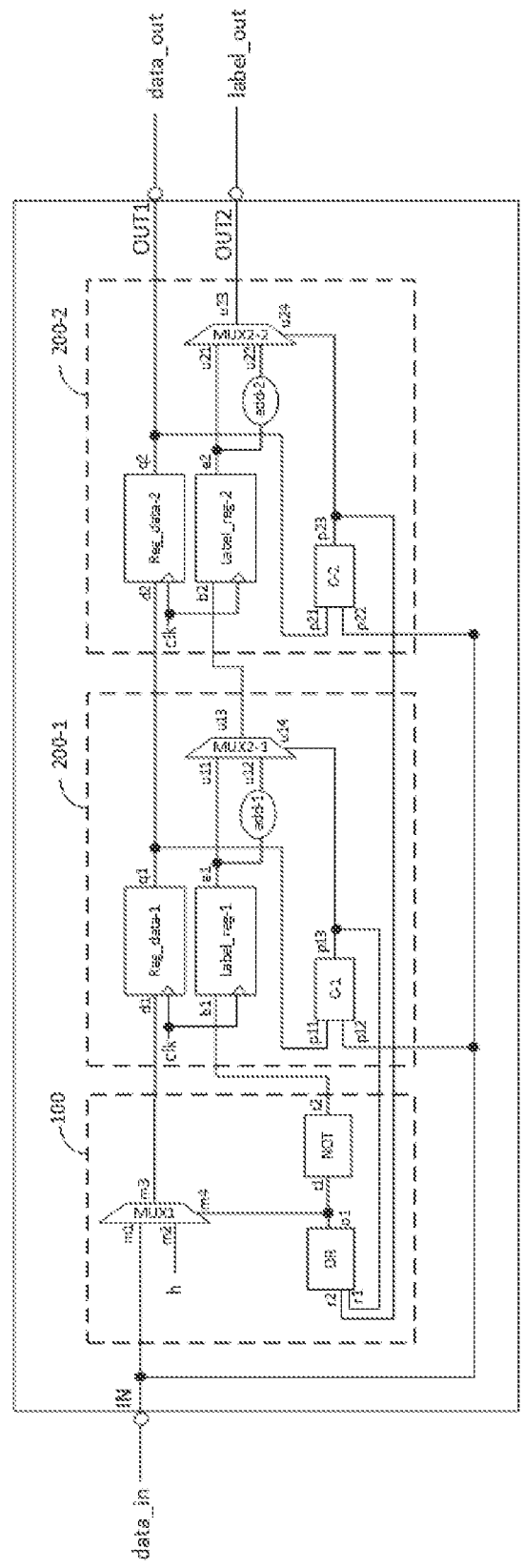
FIG. 9 is a circuit diagram of another implementation of a data mutex filter circuit according to an embodiment of the disclosure (an embodiment of two stages of filter sub-circuit).

In an embodiment, referring to FIGS. 8 and 9, in each stage of filter sub-circuit 200, the first input terminal u1 and the second input terminal u2 of the second data selector MUX2 are both coupled to the output terminal e of the frequency register Label_reg of the filter sub-circuit 200 to which the second data selector MUX2 belongs, and the frequency data input by the second input terminal u2 of the second data selector MUX2 is equal to the sum of the frequency data input by the first input terminal u1 of the second data selector MUX2 and the constant of 1; and the second selection terminal u4 of the second data selector MUX2 is coupled to the output terminal p3 of the comparator C of the filter sub-circuit 200 to which the second data selector MUX2 belongs, so as to receive the comparison result output from the comparator C. The output terminal uN3 of the second data selector MUX2-N of the Nth-stage (last-stage) filter sub-circuit 200-N is coupled to the main frequency data output terminal OUT2 of the data mutex filter circuit, namely, frequency data output from the output terminal uN3 of the second data selector MUX2-N of the Nth-stage (last-stage) filter sub-circuit 200-N is used as frequency data label_out of the main frequency data output terminal OUT2. The output terminal u3 of the second data selector MUX2 of each of the other stages of filter sub-circuits 200 is coupled to the input terminal b of the frequency register Label_reg of the next-stage filter sub-circuit 200.

Further, the input terminal b1 of the frequency register Label_reg-1 of the 1st-stage filter sub-circuit 200-1 is coupled to the preprocessing sub-circuit 100 (specifically, coupled to the output terminal o1 of the OR gate of the preprocessing sub-circuit 100), and the output terminal e1 of the frequency register Label_reg-1 of the 1st-stage filter sub-circuit 200-1 is coupled to the first input terminal u11 and the second input terminal u22 of the second data selector MUX2-1 of the 1st-stage filter sub-circuit 200-1. Then, the input terminal b of the frequency register Label_reg of each stage of filter sub-circuit 200 is coupled to the output terminal u3 of the second data selector MUX2 of the previous-stage of filter sub-circuit 200, and the output terminal of the frequency register Label_reg of each stage of filter sub-circuit 200 is coupled to the first input terminal u1 and the second input terminal u2 of the second data selector MUX2 of the filter sub-circuit 200 to which the frequency register Label_reg belongs.

The operating principle of the data mutex filter circuit provided by the embodiment of the disclosure is as follows: the second data selector MUX of each stage of filter sub-circuit 200 adds 1 to the frequency data or maintains the frequency data according to the comparison result of the comparator C, so as to perform counting, and stores the frequency data along with the data into the next-stage filter sub-circuit. Specifically, the comparator C of each stage of filter sub-circuit 200 compares the current input data data_in with the history data stored in the data register Reg_data to determine whether the current input data data_in is the same as the history data stored in the data register Reg_data. If the current input data data_in is the same as the history data stored in the data register Reg_data, the output terminal p3 of the comparator C outputs 1; and if the current input data data_in is different from the history data stored in the data register Reg_data, the output terminal p3 of the comparator C outputs 0. The output terminal p3 of the comparator C is coupled to the second selection terminal u4 of the second data selector MUX2 of the filter sub-circuit 200 to which it belongs. In response to the signal from the second selection terminal u4, if the second selection terminal u4 of the second data selector MUX2 outputs 1 (i.e., the input data data_in is the same as the history data stored in the data register Reg_data), the frequency data stored in the frequency register Label_reg and corresponding to the history data should be added by 1, the second input terminal u2 of the second data selector MUX2 is gated, and the frequency data having been added by 1 is written into the input terminal b of the frequency register Label_reg of the next-stage filter sub-circuit 200 through the output terminal u3. Conversely, if the second selection terminal u4 of the second data selector MUX2 outputs 0 (i.e., the input data data_in is different from the history data stored in the data register Reg_data), the frequency data stored in the frequency register Label_reg and corresponding to the history data remains unchanged, the first input terminal u1 of the second data selector MUX2 is gated, so that the original frequency data is written into the input terminal b of the frequency register Label_reg of the next-stage filter sub-circuit 200 from the output terminal u3. Whenever the frequency register Label_reg of a stage of filter sub-circuit 200 receives and stores the frequency data input from the previous stage of frequency register Label_reg, the history frequency data previously stored by itself is transmitted to the frequency register Label_reg of the next-stage filter sub-circuit 200, the frequency data is transferred stage by stage, and then the output terminal eN of the frequency register Label_reg-N of the Nth-stage filter sub-circuit 200-N outputs the history frequency data stored by itself through the main frequency data output terminal OUT2 as the frequency data label_out.

Furthermore, in each clock cycle, since the data register Reg_data of the filter sub-circuit 200 transmits the history data stored therein into the data register Reg_data of the next-stage filter sub-circuit 200, the frequency data corresponding to the history data stored in the data register Reg_data may be transmitted to the next-stage filter sub-circuit 200 along with the history data. Therefore, the output terminal u3 of the second data selector MUX2 of each stage of filter sub-circuit 200 is always coupled to the input terminal d2 of the frequency register Label_reg of the next-stage filter sub-circuit 200, so that the positions of the data and the frequency data of the data correspond to each other. After passing through the data mutex filter circuit provided by the present embodiments, the same data of the data stream in the preset neighborhood are merged, and the frequency of each data of the data stream can be counted.

In some examples, the frequency counting component may further include an adder add capable of an operation of adding itself by one. Specifically, the input terminal of the adder add is coupled to the output terminal e of the frequency register Label_reg of the filter sub-circuit 200 to which the adder add belongs; and the output terminal of the adder add is coupled to the second input terminal u2 of the second data selector MUX 2. The first input terminal u1 of the second data selector MUX2 is not provided with an adder, so that the frequency data output from the output terminal e of the frequency register Label_reg is provided to the first input terminal u1 and the second input terminal u2 of the second data selector MUX2, and the frequency data at the second input terminal u2 is equal to the frequency data at the first input terminal u1 plus 1.

It should be noted that, for convenience of describing the adders add of the frequency counting component of each stage of filter sub-circuit 200, the adders add of the 1st-stage filter sub-circuit to the Nth-stage filter sub-circuit are respectively denoted as add-1, add-2 . . . add-N.

In some examples, the preprocessing sub-circuit 100 may further include a NOT gate (an element denoted by "NOT" in the figure) having an input terminal t1 and an output terminal t2, the input terminal t1 of the NOT gate is coupled to the output terminal o1 of the OR gate, and the output terminal t2 of the NOT gate is coupled to the input terminal b1 of the frequency register Label_reg of the 1st-stage filter sub-circuit 200. If the data mutex filter circuit is initialized, the data in the data register Reg_data of each stage of filter sub-circuit 200 is 0. Therefore, when the first non-zero input data data_in is inputted to the main input terminal IN, the comparison result of the comparator C of each stage of filter sub-circuit 200 is 0 (i.e., "different"), and is fed back to the OR gate of the preprocessing sub-circuit 100, and then the output terminal o1 of the OR gate outputs 0. At this time, the input data data_in is stored in the data register Reg_data of the 1st-stage filter sub-circuit 200-1, and "1" is stored in the corresponding frequency register Label_reg. However, if the input terminal b1 of the frequency register Label_reg of the 1st-stage filter sub-circuit is directly coupled to the output terminal o1 of the OR gate, "0" is stored. Therefore, after the output result of the output terminal o1 of the OR gate is inverted to 1 by the NOT gate, the inverted output result is provided to the input terminal b1 of the frequency register Label_reg of the filter sub-circuit, so that "1" is stored in the frequency register Label_reg, and the accuracy of the statistical result can be ensured.

In some examples, the frequency register Label_reg of each stage of filter sub-circuit 200 further includes a clock input terminal, the clock input terminal of the frequency register Label_reg is coupled to a clock signal source, and the clock signal source outputs a clock signal clk. In each clock cycle, the frequency register Label_reg stores one frequency data and outputs one history frequency data.

In some examples, the clock input terminals of the data register Reg_data and the frequency register Label_reg of each stage of filter sub-circuit 200 are coupled to the same clock signal source, and receive the same clock signal clk, and of course, they may be coupled to different clock signal sources, but the clock signal sources output clock signals clk with the same cycle, which is not limited herein.

Figure 10:
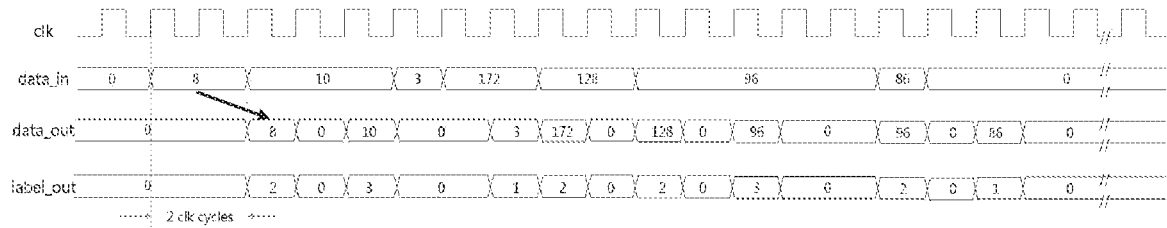
FIG. 10 is a schematic diagram of a simulated waveform of an implementation of a data mutex filter circuit according to an embodiment of the present disclosure (an embodiment of two stages of filter sub-circuits)

Referring to FIGS. 9 and 10, FIG. 10 is a waveform diagram for simulating based on the model of the data mutex filter circuit of FIG. 9. The data mutex filter circuit includes two stages of filter sub-circuits 200, that is, N=2, latency is N clock cycles (2 clock cycles), and the preset neighborhood is N+1=3. That is, within 3 clock cycles, the same input data of the data stream are merged and the frequency of each data may be counted. Through simulation verification, it can be seen that when the input data data_in is 8, the output data data_out is 8 after 2 clock cycles, and the latency is two clock cycles. The input data data_in of 8 appears twice within 3 clock cycles, so two 8 are merged into one 8 to be output during one of the two clock cycles, placeholder "0" is output during the other of the two clock cycles, and the frequency data is 2. In addition, the input data data_in is 96 in 5 clock cycles, and since the neighborhood range of the circuit is 3 clock cycles, which cannot cover 5 clock cycles, five 96 in 5 clock cycles are divided into three 96 and two 96, the output data data_out is 96 of 1 clock cycle, placeholder "0" of 2 clock cycles, 96 of 1 clock cycle and placeholder "0" of 1 clock cycle in turn, and the frequency data is also represented as three 96 and two 96 respectively. Therefore, the data mutex filter circuit can realize the data mutex filtering function and the frequency counting function.

It should be noted that, the data register Reg_data and the frequency register Label_reg of each stage of filter sub-circuit 200 are all exemplified as 8-bit registers, and of course, registers of other bits may be selected, which is not limited herein.

Figure 11:
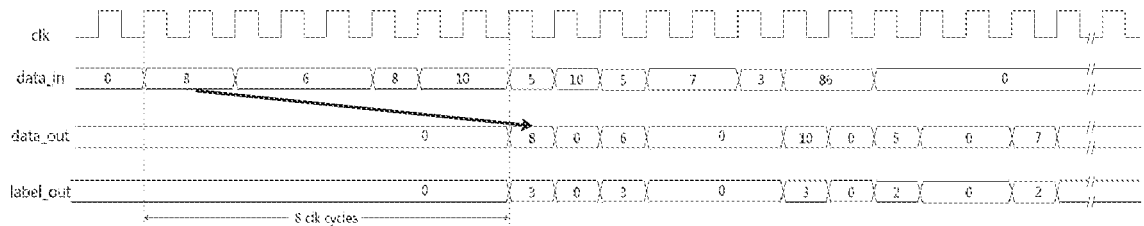
FIG. 11 is a schematic diagram of a simulated waveform of another implementation of a data mutex filter circuit according to an embodiment of the present disclosure (an embodiment of eight stages of filter sub-circuits)

Further, by adjusting the preset neighborhood range (i.e., increasing/decreasing the number of the filter sub-circuits 200), the data mutex filtering function in a larger range may be performed. For example, referring to FIG. 11, FIG. 11 shows that the data mutex filter circuit includes 8 stages of filter sub-circuits 200, that is, N=8, latency=8 clock cycles, and the preset neighborhood is N+1=9 (that is, the same input data of the data stream in 9 clock cycles are merged) and the frequency of each input data may be counted. Through simulation verification, it can be seen that when the input data data_in is 8, the output data data_out is 8 after 9 clock cycles, and latency is 9 clock cycles. In addition, the same input data data_in are merged in 9 clock cycles, and the correct frequency data is obtained. Thus, the required neighborhood range can be adjusted as desired.

Figure 12:
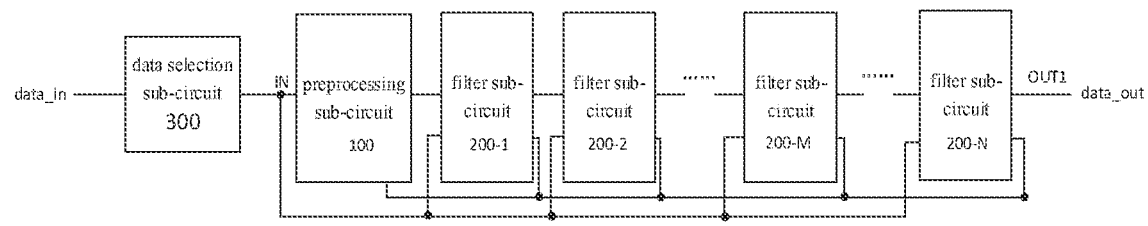
FIG. 12 is a schematic diagram illustrating an architecture of another implementation of a data mutex filter circuit according to an embodiment of the present disclosure.
Figure 13:
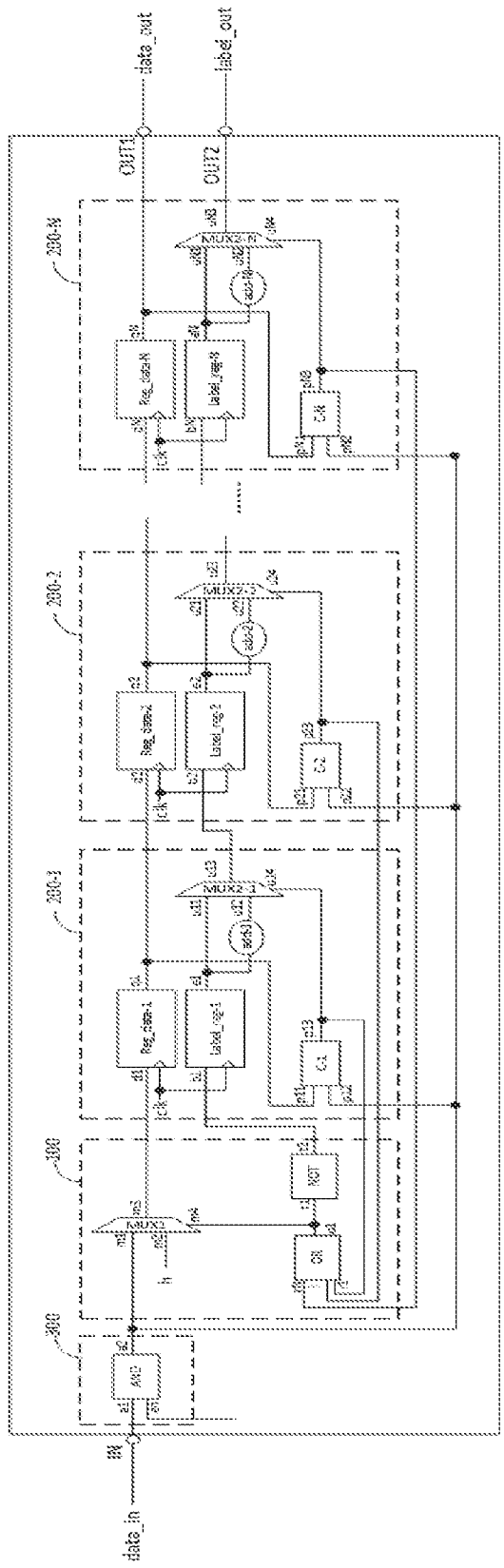
FIG. 13 is a circuit diagram of another implementation of a data mutex filter circuit according to an embodiment of the present disclosure.

In some examples, referring to FIGS. 12 to 13, the data mutex filter circuit provided by the embodiment of the disclosure may further include a data selection sub-circuit 300 configured to filter out invalid data in a data stream to pass valid data in the data stream, and the data stream is input into the data selection sub-circuit 300 to select the valid data as input data data_in to be inputted to the preprocessing sub-circuit 100 and each filter sub-circuit 200.

In some examples, the data selection sub-circuit 300 may include various types of circuit structures, and for example, the data selection sub-circuit 300 may include an AND gate (an element denoted by "AND" in the figure) having an input terminal a1, an enable terminal en, and an output terminal a2. The input terminal a1 of the AND gate is used as the main input terminal IN of the data mutex filter circuit to receive the input data data_in; the enable terminal en of the AND gate is coupled to an enable signal terminal which provides an enable signal; the output terminal a2 of the AND gate is coupled to the preprocessing sub-circuit 100 and each stage of filter sub-circuit 200. By modulating the active level of the enable signal, only when the enable signal is at an active level, the input data data_in is valid data and enters the subsequent preprocessing sub-circuit 100 and the filter sub-circuits 200; and if the enable signal is at an inactive level, the input data data_in is filtered out as invalid data.

In summary, the data mutex filter circuit provided in the embodiments of the present disclosure may be applied in various fields, including image compression coding and decoding, data statistics, data channel (compression) coding and decoding, and the like. By merging the same data of the data stream, the operation efficiency can be effectively improved. The data mutex filter circuit adapts to a pipeline architecture, so that the pipeline architecture has the technical advantages of high operation speed, high bandwidth support and the like, and the scheme can be suitable for application specific integrated circuits (ASIC) and the like, which is favorable for integration.

Figure 14:
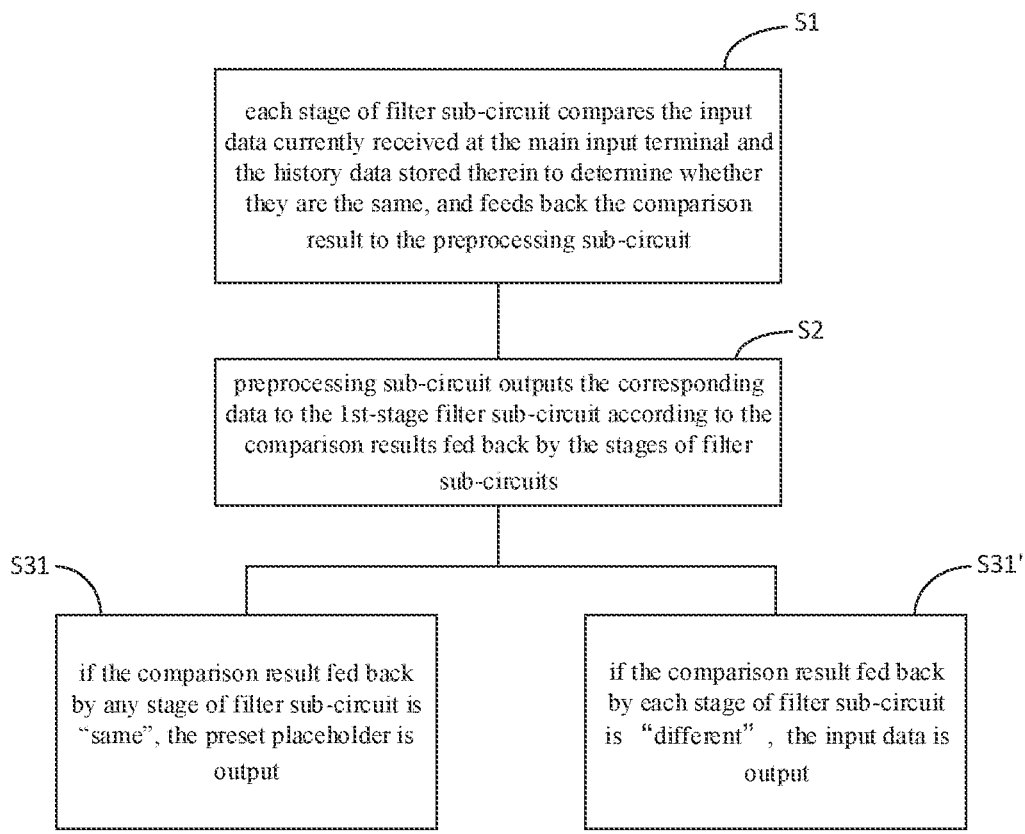
FIG. 14 is a flowchart illustrating an implementation of a data mutex filtering method according to an embodiment of the present disclosure.

In a second aspect, referring to FIG. 14, the embodiment of the present disclosure further provides a data mutex filtering method, which is applied to the data mutex filter circuit described above, and the method includes the following steps S1, S2, S31, and S31'.

Step S1 includes each stage of filter sub-circuit 200 comparing the input data data_in currently received at the main input terminal IN and the history data stored therein to determine whether they are the same, and feeding back the comparison result to the preprocessing sub-circuit 100.

Specifically, in response to the clock signal clk and in each clock cycle, the data mutex filter circuit performs the following operations: the main input terminal IN receives one input data data_in, which is first transmitted to the first input terminal m1 of the first data selector MUX of the preprocessing sub-circuit 100 and to the second input terminal p2 of the comparator C of each stage of filter sub-circuit 200, while the first input terminal p1 of each comparator C obtains the history data currently stored by the data register Reg_data from the output terminal q of the data register Reg_data of the filter sub-circuit 200 to which it belongs, and the comparator C compares the current input data data_in with the history data stored by the data register Reg_data to determine whether the two are the same, and feeds back the comparison result to one of the multiple input terminals r1 to rN of the OR gate of the preprocessing sub-circuit 100 through the output terminal p3 of the comparator C. In an embodiment, if the comparator C determines that the current input data data_in is the same as the history data stored in the data register Reg_data, the comparison result output by the output terminal p3 is 1; and if the comparator C determines that the current input data data_in is different from the history data stored in the data register Reg_data, the comparison result output by the output terminal p3 is 0.

Step S2 includes the preprocessing sub-circuit 100 outputting the corresponding data to the 1st-stage filter sub-circuit 200 according to the comparison results fed back by the stages of filter sub-circuits 200.

Specifically, the plurality of input terminals r1 to rN of the OR gate respectively receive the comparison results fed back by the output terminals p3 of the comparators C of the stages of filter sub-circuits 200.

Step S31 includes if the comparison result fed back by at least one stage of filter sub-circuits 200 is 1, the preprocessing sub-circuit 100 outputting the preset placeholder to the 1st-stage filter sub-circuit 200.

Specifically, if the history data stored in the data register Reg_data of at least one stage of filter sub-circuits 200 in the stages of filter sub-circuits 200 is the same as the current input data data_in (i.e., if the comparison result fed back by the output terminal p3 of the comparator C of at least one stage of filter sub-circuits 200 is 1), the output terminal o1 of the OR gate outputs 1 to the first selection terminal m4 of the first data selector MUX1, gates the second input terminal m2, and writes the placeholder provided by the placeholder output terminal h into the input terminal d1 of the data register Reg_data-1 of the 1st-stage filter sub-circuit 200-1 through the output terminal m3 of the first data selector MUX 1.

Step S31' includes if the comparison result fed back by each stage of filter sub-circuit 200 is 0, the preprocessing sub-circuit 100 outputting the input data data_in to the 1-st stage filter sub-circuit 200.

Specifically, if the history data stored in the data registers Reg_data of all stages of filter sub-circuits 200 is different from the current input data data_in (i.e., if the comparison result fed back by the output terminal p3 of the comparator C of each stage of filter sub-circuit 200 is 0), the output terminal o1 of the OR gate outputs 0 to the first selection terminal m4 of the first data selector MUX, gates the first input terminal m1, and writes the current input data data_in into the input terminal d1 of the data register Reg_data-1 of the 1st-stage filter sub-circuit 200-1 through the output terminal m3 of the first data selector MUX 1.

In an embodiment, the data mutex filtering method provided by the embodiments of the present disclosure further includes: every time the input data data_in is stored in a stage of filter sub-circuit 200, the history data stored in the stage of filter sub-circuit 200 is output to the next-stage filter sub-circuit 200.

Specifically, the input data data_in is transmitted stage by stage, and no matter whether the data register Reg_data-1 of the 1st-stage filter sub-circuit 200-1 stores a placeholder or the input data data_in, the history data stored by itself is transmitted to the data register Reg_data-2 of the 2nd-stage filter sub-circuit 200-2 when corresponding data is stored therein; after the data register Reg_data-2 of the 2nd-stage filter sub-circuit 200-2 stores the data provided by the data register Reg_data-1 of the 1st-stage filter sub-circuit 200-1, the history data stored is transmitted to the data register Reg_data-3 of the 3rd-stage filter sub-circuit 200-3 . . . then the data is stored stage by stage, and finally the history data stored by the data register Reg_data-N of the Nth-stage filter sub-circuit 200-N is output as the output data data_out through the main output terminal OUT1 by the output terminal qN of the data register Reg_data-N of the Nth-stage filter sub-circuit 200-N.

In an embodiment, the data mutex filtering method provided by the embodiment of the present disclosure further includes that counting the frequency of each input data and transmitting the frequency to the next-stage filter sub-circuit along with the input data.

Specifically, the second data selector MUX of each stage of filter sub-circuit 200 adds 1 to the frequency data (the frequency data represents the number of the same input data) or maintains the original frequency data according to the comparison result of the comparator C to perform counting, and stores the frequency data along with the input data in the next-stage filter sub-circuit. Specifically, the comparator C of each stage of filter sub-circuit 200 compares the current input data data_in with the history data stored in the data register Reg_data to determine whether the current input data data_in is the same as the history data stored in the data register Reg_data; if the current input data data_in is the same as the history data stored in the data register Reg_data, the output terminal p3 of the comparator C outputs 1, and if not, the output terminal p3 of the comparator C outputs 0. The output terminal p3 of the comparator C is coupled to the second selection terminal u4 of the second data selector MUX2 of the filter sub-circuit 200 to which it belongs. In response to the signal from the second selection terminal u4, if the second selection terminal u4 of the second data selector MUX2 outputs 1 (i.e., the input data data_in is the same as the history data stored in the data register Reg_data), the frequency data stored in the frequency register Label_reg and corresponding to the history data should be added by 1, the second input terminal u2 of the second data selector MUX2 is gated, and the frequency data having been added by 1 is written into the input terminal b of the frequency register Label_reg of the next-stage filter sub-circuit 200 through the output terminal u3; and conversely, if the second selection terminal u4 of the second data selector MUX2 outputs 0 (i.e., the input data data_in is different from the history data stored in the data register Reg_data), the frequency data corresponding to the history data and stored in the frequency register Label_reg remains unchanged, the first input terminal u1 of the second data selector MUX2 is gated, so that the original frequency data is written into the input terminal b of the frequency register Label_reg of the next-stage filter sub-circuit 200 through the output terminal u3. When the frequency register Label_reg of a certain stage of filter sub-circuit 200 receives and stores the frequency data transmitted by the previous stage of frequency register Label_reg, the self-stored history frequency data is transmitted to the frequency register Label_reg of the next-stage filter sub-circuit 200, and after the frequency data is transferred stage by stage, the output terminal eN of the frequency register Label_reg-N of the Nth-stage filter sub-circuit 200-N outputs the self-stored history frequency data as the frequency data Label_out through the main frequency data output terminal OUT2.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

What is claimed is:

1. A data mutex filter circuit having a main input terminal and a main output terminal and comprising a preprocessing sub-circuit and a plurality of stages of filter sub-circuits which are cascaded, wherein
the plurality of stages of filter sub-circuits comprises a 1st-stage filter sub-circuit to an Nth-stage filter sub-circuit, where N is an integer greater than or equal to 2,
the 1st-stage filter sub-circuit has an input terminal coupled to the preprocessing sub-circuit, and the Nth-stage filter sub-circuit has an output terminal coupled to the main output terminal;
each of the plurality of stages of filter sub-circuits is configured to compare input data currently received at the main input terminal and history data stored in the stage of filter sub-circuit to determine whether they are the same, and feed back a comparison result to the preprocessing sub-circuit;
the preprocessing sub-circuit is configured to output corresponding data to the 1st-stage filter sub-circuit according to the comparison result fed back by each of the plurality of stages of filter sub-circuits; and
in response to the comparison result fed back by at least one of the plurality of stages of filter sub-circuits indicating that the input data currently received at the main input terminal is the same as the history data stored therein, the preprocessing sub-circuit outputs a placeholder, and in response to the comparison result fed back by each of the plurality of stages of filter sub-circuits indicating that the input data currently received at the main input terminal is different from the history data stored therein, the preprocessing sub-circuit outputs the input data.

2. The data mutex filter circuit of claim 1, wherein the preprocessing sub-circuit comprises a first data selector and an OR gate; each of the plurality of stages of filter sub-circuits comprises a data register and a comparator;
the data register of the 1st-stage filter sub-circuit has an input terminal coupled to an output terminal of the first data selector, and an output terminal coupled to an input terminal of the data register of a 2nd-stage filter sub-circuit;
the data register of the Nth-stage filter sub-circuit has an output terminal coupled to the main output terminal;
in each of the plurality of stages of filter sub-circuits, the comparator has a first input terminal coupled to an output terminal of the data register, a second input terminal coupled to the main input terminal, and an output terminal coupled to one of a plurality of input terminals of the OR gate, wherein the output terminal of the comparator outputs the comparison result; and
the first data selector has a first input terminal coupled to the main input terminal, a second input terminal coupled to a placeholder output terminal to receive the placeholder, a first selection terminal coupled to an output terminal of the OR gate, and an output terminal.

3. The data mutex filter circuit of claim 2, wherein N is greater than 2,
the data register of the Nth-stage filter sub-circuit has an input terminal coupled to an output terminal of the data register of a (N−1)th-stage filter sub-circuit, and an output terminal coupled to the main output terminal, and
the data register of an Mth-stage filter sub-circuit has an input terminal coupled to an output terminal of the data register of a (M−1)th-stage filter sub-circuit, and an output terminal coupled to an input terminal of the data register of a (M+1)th-stage filter sub-circuit, M being an integer larger than 1 and smaller than N.

4. The data mutex filter circuit of claim 1, wherein each of the plurality of stages of filter sub-circuits is further configured to transmit the history data stored therein to a next-stage filter sub-circuit, in response to receiving the input data.

5. The data mutex filter circuit of claim 2, wherein the data register of each of the plurality of stages of filter sub-circuits further comprises a clock input terminal coupled to a clock signal source; and the clock input terminals of the data registers of the plurality of stages of filter sub-circuits are coupled to a same clock signal source.

6. The data mutex filter circuit of claim 2, wherein each of the plurality of stages of filter sub-circuits further comprises: a frequency counting component coupled to the comparator and the data register of the stage of filter sub-circuit, and configured to count, in a first time period, a frequency of a same input data in the input data received by the main input terminal, as frequency data.

7. The data mutex filter circuit of claim 6, further comprising: a main frequency data output terminal, wherein the frequency counting component comprises: a frequency register and a second data selector, wherein
in each of the plurality of stages of filter sub-circuits, the second data selector has a first input terminal, a second selection terminal and an output terminal, the first input terminal and the second input terminal of the second data selector are both coupled to an output terminal of the frequency register, and the frequency data input to the second input terminal of the second data selector is equal to a sum of the frequency data input to the first input terminal and a constant of 1, and the second selection terminal is coupled to the output terminal of the comparator,
an output terminal of the second data selector of the Nth-stage filter sub-circuit is coupled to the main frequency data output terminal, and an output terminal of the second data selector of each of the other stages of filter sub-circuits is coupled to an input terminal of the frequency register of a next-stage filter sub-circuit, and
an input terminal of the frequency register of the 1st-stage filter sub-circuit is coupled to the output terminal of the OR gate.

8. The data mutex filter circuit of claim 7, wherein the frequency counting component further comprises an adder having an input terminal coupled to the output terminal of the frequency register, and an output terminal coupled to the second input terminal of the second data selector.

9. The data mutex filter circuit of claim 7, wherein the preprocessing sub-circuit further comprises: a NOT gate having an input terminal coupled to the output terminal of the OR gate, and an output terminal coupled to the input terminal of the frequency register of the 1st-stage filter sub-circuit.

10. The data mutex filter circuit of claim 8, wherein the preprocessing sub-circuit further comprises: a NOT gate having an input terminal coupled to the output terminal of the OR gate, and an output terminal coupled to the input terminal of the frequency register of the 1st-stage filter sub-circuit.

11. The data mutex filter circuit of claim 1, further comprising: a data selection sub-circuit configured to filter out invalid data and pass valid data, wherein after the valid data input into the main input terminal passes through the data selection sub-circuit, the valid data is used as the input data to be provided to the preprocessing sub-circuit and the plurality of stages of filter sub-circuits.

12. The data mutex filter circuit of claim 10, further comprising: a data selection sub-circuit configured to filter out invalid data and pass valid data, wherein after the valid data input into the main input terminal passes through the data selection sub-circuit, the valid data is used as the input data to be provided to the preprocessing sub-circuit and the plurality of stages of filter sub-circuits.

13. The data mutex filter circuit of claim 11, wherein the data selection sub-circuit comprises an AND gate having an input terminal serving as the main input terminal, an enable terminal coupled to an enable signal terminal, and an output terminal coupled to the preprocessing sub-circuit and the plurality of stages of filter sub-circuits.

14. The data mutex filter circuit of claim 10, wherein the placeholder is invalid data.

15. A data mutex filtering method, applied to the data mutex filter circuit of claim 1, the method comprising:
comparing, by each of the plurality of stages of filter sub-circuits, the input data currently received at the main input terminal and the history data stored in the stage of filter sub-circuit to determine whether they are the same, and feeding back the comparison result to the preprocessing sub-circuit;
outputting, by the preprocessing sub-circuit, corresponding data to the 1st-stage filter sub-circuit according to the comparison result fed back by each of the plurality of stages of filter sub-circuits; and
if the comparison result fed back by at least one of the plurality of stages of filter sub-circuits indicates that the input data currently received at the main input terminal is the same as the history data stored in the stage of filter sub-circuit, outputting a placeholder, and if the comparison result fed back by each of the plurality of stages of filter sub-circuits indicates that the input data currently received at the main input terminal is different from the history data stored in the stage of filter sub-circuit, outputting the input data.

16. The method of claim 15, further comprising:
when a stage of filter sub-circuit stores the input data, outputting the history data stored therein to a next-stage filter sub-circuit.

17. The method of claim 15, further comprising:
counting a frequency of the input data, by each of the plurality of stages of filter sub-circuits, to obtain frequency data, wherein the frequency data is transmitted to a next-stage filter sub-circuit along with the input data.

* * * * *